Figures 1, 1A, 1B:
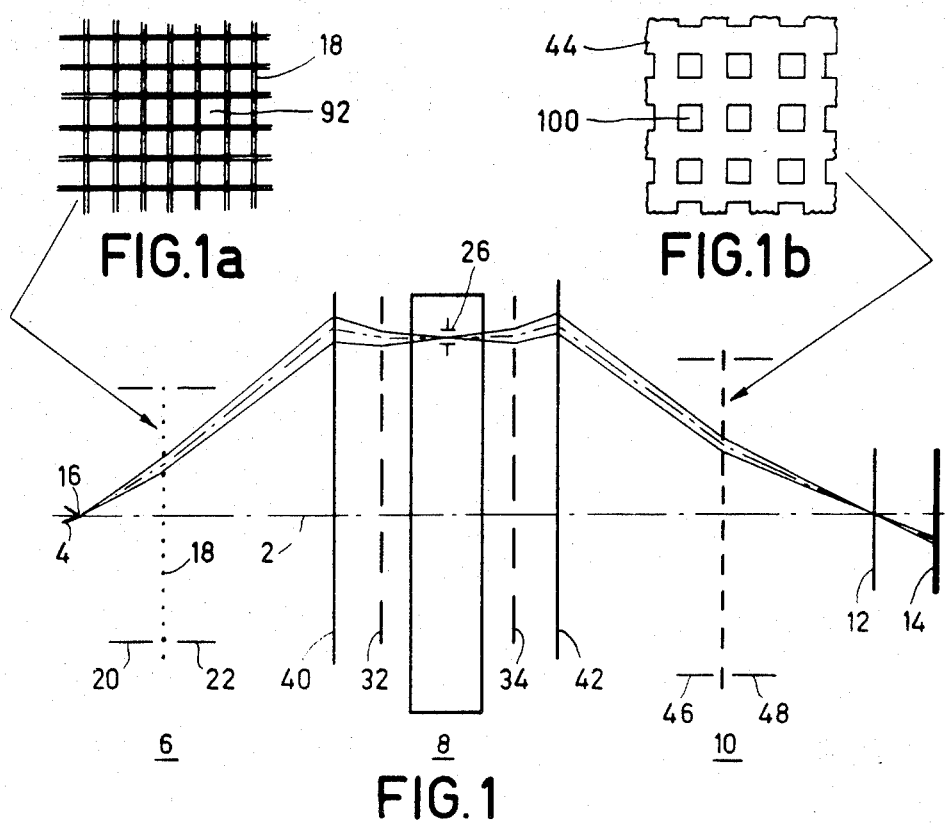

United States Patent [19]

Le Poole

[11] Patent Number: 4,524,278
[45] Date of Patent: Jun. 18, 1985

[54] CHARGED PARTICLE BEAM EXPOSURE DEVICE INCORPORATING BEAM SPLITTING

[76] Inventor: Jan B. Le Poole, Kennedyplantsoen 56, Voorschoten, Netherlands

[21] Appl. No.: 465,937

[22] Filed: Feb. 14, 1983

[30] Foreign Application Priority Data

Feb. 15, 1982 [NL] Netherlands ............... 8200559

[51] Int. Cl.$^3$ .......................................... H01J 37/30
[52] U.S. Cl. ................................. 250/398; 250/492.2
[58] Field of Search ............... 250/398, 396, 492.2, 250/492.3

[56] References Cited

U.S. PATENT DOCUMENTS 3,491,236 1/1970 Newberry ............. 250/492.2 X
3,715,580 2/1973 Maekawa et al. ....... 250/492.2 X

FOREIGN PATENT DOCUMENTS 57-206029 12/1982 Japan ................... 250/492.2

Primary Examiner—Alfred E. Smith
Assistant Examiner—Jack I. Berman
Attorney, Agent, or Firm—Paul R. Miller

[57] ABSTRACT

An electron source or ion source of a charged particle beam exposure device comprises a matrix of elements, each of which forms an elementary beam. The matrix is arranged in a field space such that the elementary beams emerge from the matrix in a mutually diverging manner. At the area where the distance between the elementary beams is sufficiently large, there is arranged an electrode system with a matrix of beam deflectors in which each of the elementary beams can be independently manipulated. Near a target to be exposed, there is arranged an aperture plate which completely or partly transmits each of the modulated elementary beams so that spot-shaping can be performed. Using the device in accordance with the invention, some one hundred possible different patterns can be written simultaneously.

28 Claims, 6 Drawing Figures

CHARGED PARTICLE BEAM EXPOSURE DEVICE INCORPORATING BEAM SPLITTING

The invention relates to a device for exposing a target to be positioned in an object space to a beam of charged particles with the device comprising a radiation source and a beam modulation system with a beam splitting device situated near the object space.

A device of this kind is known from U.S. Pat. No. 3,491,236 wherein the device is described as part of an electron beam exposure apparatus. Using a beam splitting device arranged near a target to be exposed, several areas of the target can be exposed without displacement of the target. This benefits the accuracy of the orientation of the patterns to be formed. Moreover, by utilizing an electron beam having a large cross-section at the area of the beam splitting device, several elementary beams can be used simultaneously in an identical manner, so that the operating speed is increased.

When a single scanning beam is used in the described apparatus, the operating speed will be too low for many applications. When use is made of elementary beams derived from a fan-shaped beam, of course, only identical patterns can be formed; and this represents a restriction for many applications. The mutual homogeneity of the elementary beams thus formed is usually inadequate for obtaining substantially identical products. Improvement of the necessary homogeneity in the local current density distribution of the fan-shaped beam, for example, by using a wider beam with a larger total current, causes a life-reducing increased loading of the beam splitting device which is excessively heated by intercepted beam particles as well as an increased source cathode load. Moreover, in such a beam an increased energy spread of the particles occurs; this is extremely detrimental to the accuracy of the apparatus.

It is an object of the invention to provide a device in which these drawbacks are avoided or at least substantially mitigated. To this end, a charged-particle beam exposure device of the kind set forth in accordance with the invention is characterized in that the device comprises a further beam-splitting device arranged near the radiation source, and an electrode system which comprises a multiple beam deflector included between the two beam splitting devices.

Because a beam splitting device is included at the source side in the device in accordance with the invention, a beam of elementary beams can be formed whose cross-section and spacing can be selected by selection of the geometry and the optical adjustment. Each of the elementary beams can thus be separately manipulated, so that a high flexibility is obtained. Moreover, thanks to the division of the beam into separate elementary beams, the effects of particle interactions are reduced so that the exposure accuracy of the apparatus is enhanced. Because the radiation beam is already divided into a matrix of elementary beams at the source side of the device, any scatter that occurs can be intercepted more easily, so that adverse effects on the workpiece can be avoided.

In a preferred embodiment the beam splitting device which is situated near the radiation source comprises a grid structure on either side of which, viewed in the movement direction of the radiation beam, there is provided a preferably symmetrical lens system. By selection of the geometry and the potentials to be applied it can be ensured that a homogeneous field strength prevails at least across a large part of the grid structure. This part of the surface can be increased by using a curved grid structure. By potential selection of the grid and the adjoining electrodes it is possible to form a diverging lens whereby the incident beam of charged particles is divided into a matrix of mutually diverging elementary beams. Thanks to the small lens effect of the gauze apertures, each of these elementary beams constitutes a beam with an angle of aperture yet to be selected.

Because the division of the radiation beam is achieved mainly by an electric field effect and only to a small extent by the shadow effect of the gauze structure, the latter has a high transmission coefficient. Consequently, substantially the total current supplied by a cathode of the source will be effectively used, so that even fewer problems will be experienced from the interactions and the gauze structure will not be exposed to excessively high thermal loads.

When the deflector is situated at a suitable distance, for example, 200 mm behind the first beam splitting device, the beams will be spaced so far apart that they can be individually influenced at that area by means of a matrix of deflection elements.

In a further preferred embodiment, the beam deflector is preceded by a lens system which directs each of the elementary beams parallel to the optical axis by way of a beam deflector which is directed transversely of the optical axis of the device. This lens system preferably forms part of a lens which images the source-side beam splitting device on the object-side beam splitting device and which comprises a second, preferably symmetrical lens system on the other side of the matrix of deflectors for this purpose.

On each side of the beam deflector in a further embodiment there is provided an aperture plate which transmits the elementary beams and which by way of a suitable choice of the potential with respect to the deflector can compensate for a converging effect for the principal way of the elementary beams by the imaging lenses.

By making the object-side beam splitting device operate also as a diverging lens, it can be achieved that the cross-over of the elementary beams coincides at least substantialy with an image of the source. Using known means, for each of the elementary beams spot-shaping can be performed, for example as described in U.S. Pat. No. 4,151,422. Consequently, within broad limits each of the elementary beams can individually and independently expose an object or provide it with a desired pattern.

Some preferred embodiments of a charged-particle beam exposure device in accordance with the invention will be described in detail hereinafter with reference to the drawing.

Figure 3:
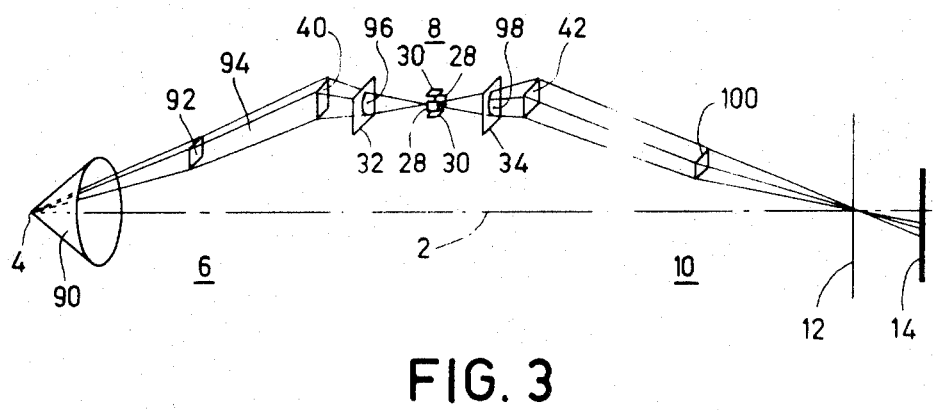
Figure 2:
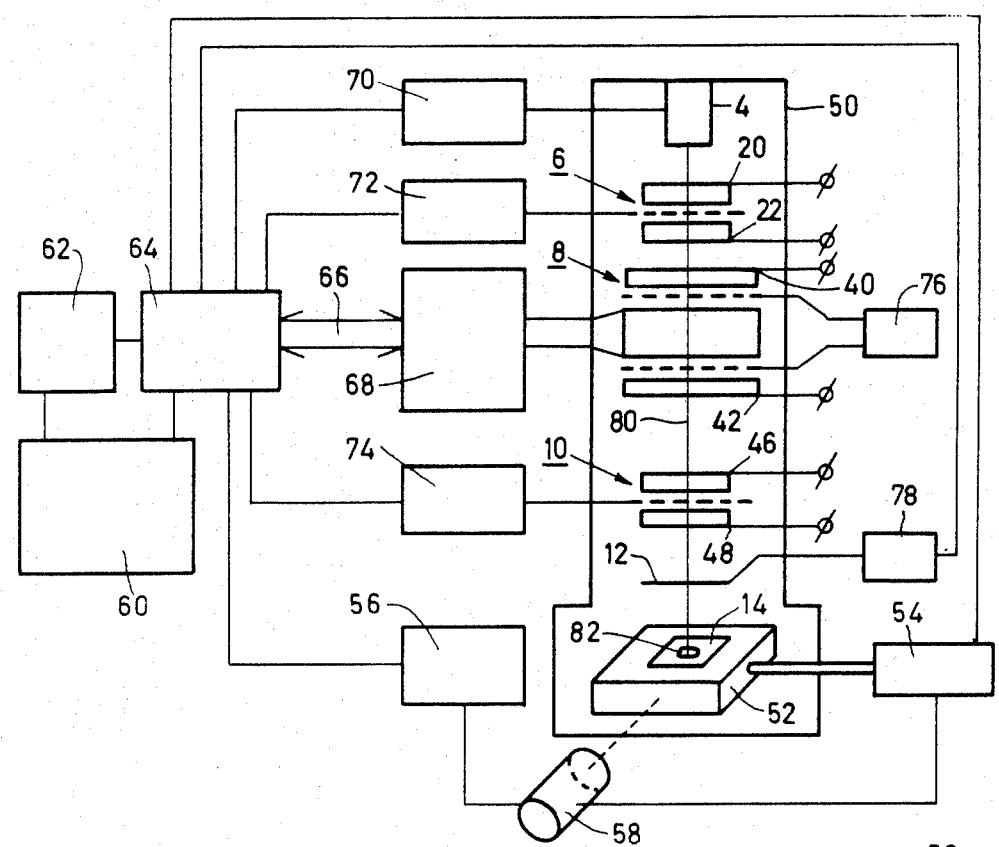
Figure 4:
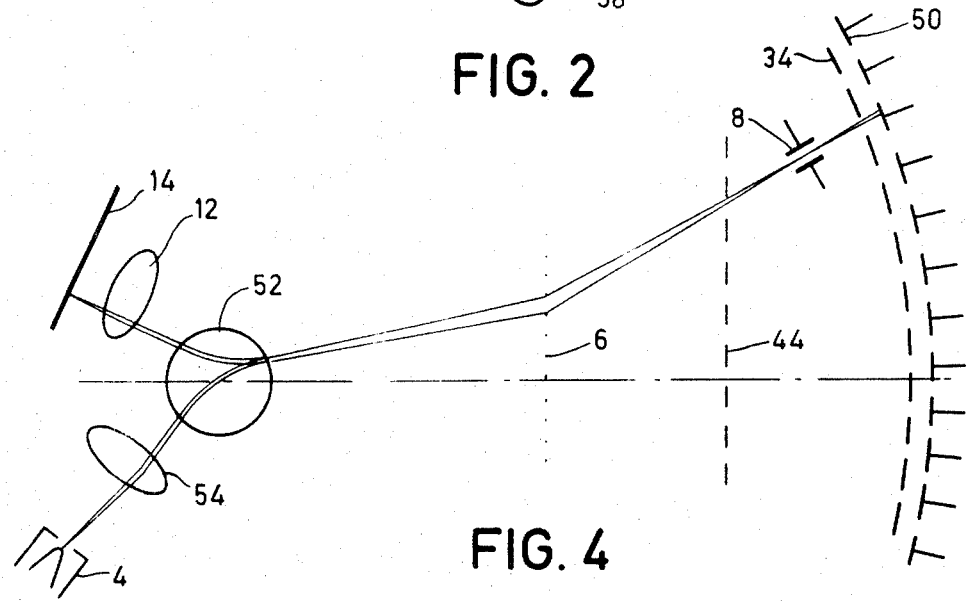

Therein:

FIG. 1 diagrammatically shows the imaging section of a device in accordance with the invention, FIGS. 1a and 1b show elements of this imaging system, FIG. 2 shows a device in accordance with the invention in the form of an electron beam pattern writer, FIG. 3 shows a beam path through such a device with spot-shaping, and FIG. 4 shows a beam modulator system comprising a reflector matrix.

FIG. 1 shows the following components of a device in accordance with the invention which are arranged about an optical axis 2: a radiation source 4, a first beam splitting device 6, a beam deflection system 8, a second beam splitting device 10, a reducing imaging lens 12, and a target 14. The radiation source is shown as a single source having a single emissive point 16 which will be referred to hereinafter as the object point, even though the optical object point in an image may be shifted in the direction of the optical axis with respect thereto during an imaging operation. The source may also comprise a matrix of emitting elements, for example, as described in U.S. Pat. No. 4,259,678. The source may alternatively be composed as disclosed in EP Patent 00 28 585, but be constructed so that each of the mirror elements acts as a controllable source by control of the potential thereof. In a multiple source of this kind the first beam splitting device 6 forms part of the source. In the case of a single source or a multiple source with insufficiently defined beam splitting, beam splitting is performed by means of a separate beam splitting device 6. This beam splitting device 6 comprises a gauze structure 18, an embodiment of which is shown in FIG. 1a. The embodiment shown is composed of two wire grids which are transversely oriented with respect to one another and which are made, for example, of tungsten wire having a thickness of, for example 10 $\mu$m, and a pitch of 100 $\mu$m. Both wire grids may be mounted against or in one another, but in order to reduce faults in the beam shape, for example, due to charging phenomena on the wire grid, it may be advantageous to mount the wire grids at some distance from one another, for example, at a distance corresponding to the pitch of the grids measured along the optical axis. For sharp definition of the beams by suppression of scatter, use can advantageously be made of wire grids made of band material having approximately the same transmission. On either side of the gauze structure there are provided electrodes 20 and 22 which preferably consist of one or more bushes or ring electrodes, the geometry and the distance from the gauze being adjusted so that an at least substantially homogeneous field strength is achieved at least across a central part of the gauze surface. By constructing the combined wire grids to be convex, better adaptation to equipotential planes of the electric field generated by the electrodes 20 and 22 is achieved, and hence also a homogeneous field strength across a substantially larger part of the gauze structure.

The beam deflection system of the embodiment shown comprises a matrix of deflection elements 26 (shown in FIG. 1) with an electrode array 28 (shown in greater detail in FIG. 3) for deflection in an x-direction and an electrode array 30 for deflection in a y-direction transversely of the x-direction. The electrode arrays may all be mounted in the same plane, transversely of the optical axis, but in order to prevent imaging faults due to field inhomogeneities, it may be attractive to arrange the arrays one behind the other in the dirction of the optical axis. Thus a lower capacitive coupling is also achieved, so that any crosstalk between the two arrays during control can be reduced. The electrodes provide apertures having, for example, transverse dimensions of from 0.5 to 2.0 mm for each of the elementary beams and are provided with a pitch of, for example, from 1 to 5 mm. A potential is to be applied to at least one electrode of each electrode array, but preferably to both electrodes. The matrix of deflection elements may also be composed of electrodes mounted on an insulating carrier, for example, by means of the so-called thick-film technique. A carrier provided with the desired apertures and made, for example, of $Al_2O_3$ with a thickness of 0.5 mm, is provided on both sides with an array of electrodes and conductive tracks for applying the desired potentials thereto. It is an advantage that the element may then have a symmetrical construction, so that the risk of undesired deformation is reduced also in the case of thermal loads. The matrix of deflection elements is in this case adjoined by a first aperture plate 32 and a second aperture plate 34. These aperture plates may be identical when the beam path is adapted and may be shaped for example, as one of the gauzes shown in FIG. 1. The aperture plates may have an electric field applied by means of neighboring ring-shaped electrodes. The apertures thereof may also have a shape other than a rectangular shape, for example, a circular or hexagonal shape. The square apertures 100 of the gauze 10 are adapted to the local cross-sections of the elementary beams and amount to, for example, $0.5 \times 0.5$ mm$^2$ with a pitch of 2 mm in the x-direction as well as the y-direction. These apertures are provided in metal plates so that a fixed potential can again be applied to the aperture system. The first aperture plate 32 is preceded by a first lens 40, and behind the second aperture plate 34 there is arranged a second lens 42; these lenses may be identical. Using a homogeneous field across the matrix of deflection elements, the lenses serve to direct, the combined beam parallel to the optical axis before the first aperture plate and to converge it again towards the optical axis after the second aperture plate. At the area of the second aperture plate, each of the elementary beams can then enclose a different, be it extremely small angle with respect to the optical axis. Evidently, the number of elementary beams is determined by the number of deflectors which can be arranged between the imaging lenses 40 and 42. The available space will be limited by the maximum permissible spherical aberration.

The second beam splitting device 10 may have a construction which is identical to that of the first beam splitting device, so it may again comprise a gauze structure 44, a first electrode 46 and a second electrode 48. By choosing the appropriate geometry and potentials, a diverging lens effect can again be achieved for the charged particles. Again none of the elementary beams as such will be influenced to any significant degree. The lens 12 which is arranged behind the second beam splitting device is constructed as a reducing imaging lens which projects the elementary beams on the target 14 in the given mutual orientation without significantly influencing these beams. At the area of the target, the elementary beams have a square cross-section of for example, $1 \times 1 \mu^2$ which can be reduced by means of spot-shaping. The target may be semiconductor substrate in which patterns are directly formed by means of the elementary beams.

The target may alternatively be a mask in which a radiation-sensitive layer deposited on a mask plate is treated by the elementary beams for development, at a later stage. Other types of target will be described hereinafter.

FIG. 2 shows a device in accordance with the invention in the form of an electron beam lithography apparatus. In a column 50 in which vacuum prevails during operation there are arranged the radiation source 4, the first beam splitting device 6, the beam deflection system 8, the second beam splitting device 10, the imaging lens 12, and a target 14. The target here consists of a wafer of semiconductor material on which an integrated circuit is to be provided. The wafer is arranged on a table 52 so that it can be displaced in the x-direction as well as the y-direction in a defined manner. To this end, the device comprises an x-y drive mechanism 54 and an x-y position measuring device 56 with, for example, an optical x-y position detector 58.

A read device 60 comprises means for reading, for example, a drawing of a pattern to be inscribed and applies signals derived therefrom to a memory 62 for the preferably digital storage, or directly to a control unit 64 for direct processing. In the control unit the signals are converted into digital control signals for each of the elements of the deflection system. To this end, the signals are applied to a digital-to-analog converter 68 via a data bus 66. Writing can take place, for example, at a rate of 1 $\mu$/s per tool unit, requiring a control frequency of 1 MHz for each elementary beam.

For a matrix of, for example, $10 \times 10$ independently controllable elementary beams, this means a control frequency of 100 MHz. Spot-shaping where per channel operation takes place in steps of, for example, $\frac{1}{4}$ elementary beam between 0 and 1 for the x-direction as well the y-direction, results in a higher effective write frequency. Evidently, when a single beam is used, a high control frequency will then also be required. For given applications, such high frequencies and the local current densities to be used may impose limitations, for example, due to the Boersch effect, as regards the accuracy of, for example, the minimum dimension to be exposed, or the boundary definition on the target. In especially adapted systems use can be made of ion beams instead of electron beams. Per ion, even if it concerns an H+ ion, a substantially larger amount of energy is transferred, so that a substantially smaller number of particles per elementary beam can be used, and hence also a substantially smaller current density. The well-defined penetration depth into the target material is an additional advantage of ion beams. A radiation-sensitive layer can thus be exactly adapted to the use of an ion beam with a predetermined energy and undesired ion implantation can be prevented. On the other hand, when adapted for ion radiation, a device in accordance with the invention, can be successfully used for local ion implantation.

The higher energy transfer per particle when using ions also causes increased heating of parts of the apparatus struck by the particles. Therefore, it may be advantageous to decelerate the particles at the area of the modulator, so that at the same time the beam deflection can be realized with smaller control pulses. Thereafter, the particles are accelerated without disturbing mutual relationships of the elementary radiation beams. Considering the high energy transmission, notably when spot-shaping is applied, more severe requirements will be imposed, for example, on the second gauze structure as regards the resistance against the thermal loading and ion pulverization.

Also connected to the control unit 64 are a control device 70 for the pulsating activation of the source, so that the beam is blanked, for example, during the shifting of the spot, and power supply sources 72 and 74 for the first and the second beam splitting device, respectively. By appropriate terminals the desired potentials can be applied to the electrodes 20, 22, 40, 42, 46 and 48 from conventional voltage sources (not shown). The two gauzes 32 and 34 are connected to a power supply source 76 and the power supply source 78 is included for the lens 12. FIG. 2 shows only one beam 80 which extends along the optical axis. Using a beam consisting of, for example, a matrix of $10 \times 10$ elementary beams each having a cross-section of $1 \times 1$ $\mu m^2$ and a pitch of 2 $\mu m$, a field of $20 \times 20$ $\mu m^2$ can be completely exposed in four deflection steps. This field is followed by deflection to a next field of $20 \times 20$ $\mu m^2$ and the procedure is repeated. Should the aberrations due to the principal deflection become excessive, the target is shifted; this takes place, for example, after the exposure of a field of $2 \times 2$ mm$^2$. Thus, using a matrix of $10 \times 10$ elementary beams, a square of $2 \times 2$ mm$^2$ can be inscribed with an arbitrary pattern for each of the 100 squares without mechanical displacement of the target 14.

FIG. 3 shows the beam path of an elementary beam in a device in accordance with the invention. From a beam 90 which emerges from the source 4 and which has an angle of aperture of, for example 0.5°, an elementary beam 94 having an angle of aperture of, for example, 0.05° is selected by the first beam splitting device 6, with only an aperture 92 being shown. The elementary beam 94 is preferably deflected by the first lens 40 of the deflection system so that it impinges at least substantially perpendicularly on the beam deflector 8. Two x-deflection electrodes 28 two y-deflection electrodes 30, and two optically corresponding apertures 96 and 98 of each of the grids 32 and 34 of an element of the matrix of beam deflectors are shown. One of the grids, for example, the grid 34, may be omitted, but usually it will be advantageous to make this grid act as a correction lens for particle optical aberrations of the grid 32. The second lens 42 converges the beam towards the optical axis 2 of the device again. The elementary beam then passes through the second beam splitting device 10 with a single aperture 100 being shown. Thanks to the use of beam shaping, the object point of the elementary beams is situated on the grid 10. The element 12, being shown as a reducing lens, may then also have a deflection function. However, any known type of beam shaping may be used. The lens effect of the device is adjusted so that the cross-over of the elementary beams at least substantially coincides with an image of the source. By a suitable choice of the strength of the elements, if desirable, the total lens effect of this device can be reduced to zero.

In an embodiment as shown in FIG. 4 the two lenses 40 and 42 are replaced by a mirror system 50 whose spherical aberration can be corrected in known manner. The forward and return beams are separated in known manner by means of a magnetic field 52. Preferably, an image of the source is imaged in the center of this magnetic field by means of a lens 54. It is an additional advantage of the mirror system that supply leads can be mounted completely on the rear side thereof in order to avoid disturbances.

When use is made of a source having a single emissive surface and a beam splitting device which is arranged at some distance therefrom, the homogeneity of the current density across a part of the beam modulator which is to be effectively used can be improved by making the beam perform a scanning motion. The scanning frequency to be used must then be sufficiently higher, for example 100 times higher, than the highest frequency occurring during write control. When use is made of a linear emitter, for example, as described in U.S. Pat. No. 3,745,342, a single linear scan transversely of the longitudinal direction of the emitter suffices. Scanning may also be performed by making the beam successively occupy, for example, four different positions.

The invention has been described mainly with reference with equipment for ion or electron lithography. The invention can be used equally well, for example, for ion implantation, for the display of figures or alphanumerical information on a screen by means of beams of charged particles, preferably by means of electron beams, and for microformat recording of, for example, image information for filing.

What is claimed is:

1. A device for exposing a target to be positioned in an object space to a beam of charged particles, said device comprising in sequence along an optical axis
   a radiation source,
   a first beam splitting device arranged near said radiation source, said first beam splitting device including two systems of parallel wires directed transversely to one another and means for applying mutually different potentials to said two systems of parallel wires,
   a multiple beam deflection system including an electrode system and a beam modulation system,
   a second beam splitting device, and
   a target positioned near said second beam splitting device.

2. A device according to claim 1, wherein said beam modulation system is arranged after said first beam splitting device at a distance to separate elementary radiation beams, and wherein said beam modulation system includes a matrix of individually and independently controllable beam deflectors for each elementary radiation beam.

3. A device according to claim 1, wherein said multiple beam deflection system includes a lens system for directing elementary radiation beams perpendicularly to said deflection system, and for converging said beams after said deflection system.

4. A device according to claim 1, wherein said multiple beam deflection system includes at least one aperture plate for transmitting elementary radiation beams, and ring-shaped electrodes adjacent to said at least one aperture plate for applying an electric field thereto.

5. A device according to claim 1, wherein a first and second gauze structure are located at each side of said multiple beam deflection system, said gauze structure transmitting elementary radiation beams, and wherein ring-shaped electrodes apply an electric field to said gauze structures.

6. A device according to claim 1, wherein said multiple beam deflection system includes deflection elements for an x-direction and deflection elements for a y-direction, said deflection elements being in planes separated from one another and in planes parallel to said optical axis.

7. A device according to claim 6, wherein said multiple beam deflection system includes a matrix of controllable mirror electrodes.

8. A device according to claim 1, wherein said multiple beam deflection system includes an electrically insulating carrier plate, deflection electrodes on either side of said carrier plate, said deflection electrodes being metal layer portions, and electrically conductive tracks provided on said carrier plate, said electrically conductive tracks providing control potentials to said deflection electrodes.

9. A device according to claim 1, wherein said radiation source includes a matrix of emissive elements, said matrix also acting as said first beam splitting device.

10. A device according to claim 4, wherein said aperture plate has a hexagonal configuration forming elementary radiation beams with hexagonal or circular cross-sections.

11. A device according to claim 1, wherein controllable optical means are provided for performing spot-shaping of the charged particles for elementary radiation beams.

12. A device according to claim 1, wherein an electron-lithographic apparatus is provided for forming patterns, said patterns defining microcircuits by a read apparatus for reading drawings of said patterns.

13. A device according to claim 1, wherein an ion lithographic apparatus is provided for writing patterns in said target.

14. A device according to claim 13, wherein said beam modulation system is preceded by means for decelerating an ion beam, and is followed by means for accelerating said ion beam without disturbing mutual relationships of elementary radiation beams.

15. A device for exposing a target to be positioned in an object space to a beam of charged particles, said device comprising in sequence along an optical axis,
   a radiation source,
   a first beam splitting device arranged near said radiation source, said first beam splitting device including a gauze structure and an electrode array at each side of said gauze structure to homogenize an electric field generated near said gauze structure,
   a multiple beam deflection system including an electrode system and a beam modulation system,
   a second beam splitting device, and
   a target positioned near said second beam splitting device.

16. A device according to claim 15, wherein said beam modulation system is arranged after said first beam splitting device at a distance to separate elementary radiation beams, and wherein said beam modulation system includes a matrix of individually and independently controllable beam deflectors for each elementary radiation beam.

17. A device according to claim 15, wherein said multiple beam deflection system includes a lens system for directing elementary radiation beams perpendicularly to said deflection system, and for converging said beams after said deflection system.

18. A device according to claim 15, wherein said multiple beam deflection system includes at least one aperture plate for transmitting elementary radiation beams, and ring-shaped electrodes adjacent to said at least one aperture plate for applying an electric field thereto.

19. A device according to claim 15, wherein a first and second gauze structure are located at each side of said multiple beam deflection system, said gauze structure transmitting elementary radiation beams, and wherein ring-shaped electrodes apply an electric field to said gauze structures.

20. A device according to claim 15, wherein said multiple beam deflection system includes deflection elements for an x-direction and deflection elements for a y-direction, said deflection elements being in planes separated from one another and in planes parallel to said optical axis.

21. A device according to claim 20, wherein said multiple beam deflection system includes a matrix of controllable mirror electrodes.

22. A device according to claim 15, wherein said multiple beam deflection system includes an electrically insulating carrier plate, deflection electrodes on either side of said carrier plate, said deflection electrodes being metal layer portions, and electrically conductive tracks provided on said carrier plate, said electrically conductive tracks providing control potentials to said deflection electrodes.

23. A device according to claim 15, wherein said radiation source includes a matrix of emissive elements, said matrix also acting as said first beam splitting device.

24. A device according to claim 18, wherein said aperture plate has a hexagonal configuration forming elementary radiation beams with hexagonal or circular cross-sections.

25. A device according to claim 15, wherein controllable optical means are provided for performing spot-shaping of the charged particles for elementary radiation beams.

26. A device according to claim 15, wherein an electron-lithographic apparatus is provided for forming patterns, said patterns defining microcircuits by a read apparatus for reading drawings of said patterns.

27. A device according to claim 15, wherein an ion lithographic apparatus is provided for writing patterns in said target.

28. A device according to claim 27, wherein said beam modulation system is preceded by means for decelerating an ion beam, and is followed by means for accelerating said ion beam without disturbing mutual relationships of elementary radiation beams.

* * * * *